United States Patent [19]

Arakawa et al.

[11] 4,083,719

[45] Apr. 11, 1978

[54] COPPER-CARBON FIBER COMPOSITES AND PROCESS FOR PREPARATION THEREOF

[75] Inventors: Hideo Arakawa; Keiichi Kuniya; Takashi Namekawa, all of Hitachi; Tomio Iizuka, Naka, all of Japan

[73] Assignee: Hitachi, Ltd., Japan

[21] Appl. No.: 737,023

[22] Filed: Oct. 29, 1976

[30] Foreign Application Priority Data

Oct. 29, 1975 Japan .................................. 50-129269

[51] Int. Cl.$^2$ .............................................. C22C 1/09
[52] U.S. Cl. .................................. 75/229; 75/DIG. 1; 75/201; 75/203; 75/211; 75/226; 75/236; 75/247; 252/503; 252/504
[58] Field of Search ............... 75/DIG. 1, 200, 226, 75/224, 201, 203, 204, 229, 211, 236, 247, 229; 29/182.5, 419; 252/503, 504; 428/549, 568, 569

[56] References Cited

U.S. PATENT DOCUMENTS

| | | | |
|---|---|---|---|
| 3,001,238 | 9/1961 | Goeddel et al. | 252/504 X |
| 3,127,668 | 4/1964 | Troy | 75/DIG. 1 |
| 3,231,341 | 1/1966 | Sump et al. | 75/DIG. 1 |
| 3,623,981 | 11/1971 | Giltrow | 75/DIG. 1 |
| 3,653,882 | 4/1972 | Petrasek | 75/DIG. 1 |
| 3,796,587 | 3/1974 | Sara | 75/DIG. 1 |
| 3,807,996 | 4/1974 | Sara | 75/DIG. 1 |
| 3,827,129 | 8/1972 | Denham et al. | 29/419 |
| 3,888,661 | 4/1974 | Levitt et al. | 428/549 X |
| 3,918,141 | 11/1975 | Pepper et al. | 75/DIG. 1 |

OTHER PUBLICATIONS

Metcalfe, A. G. et al., Materials and Methods, Nov. 1955, pp. 96–98.

*Primary Examiner*—Richard E. Schafer
*Attorney, Agent, or Firm*—Craig & Antonelli

[57] ABSTRACT

Copper powder, carbon fibers arranged in random directions and a metal capable of reacting with carbon fibers are homogeneously mixed together, and the mixture is heated and molded under high pressure to form an integral composite. The so formed carbon fiber-copper matrix composite has no directional characteristic in mechanical properties, and the linear thermal expansion coefficient of the composite is low and the thermal stability of the composite is so high that when it is exposed to high temperature, no damage by thermal deformation is caused.

11 Claims, 3 Drawing Figures

(×500)

COPPER-CARBON FIBER COMPOSITES AND PROCESS FOR PREPARATION THEREOF

BACKGROUND OF THE INVENTION

The present invention relates to a novel copper-carbon fiber composite having a low linear thermal expansion coefficient and no directional property, and to a process for the preparation thereof.

Carbon fibers have a high strength, a high elastic modulus, a high heat resistance and a high wear resistance and are characterized by a desirable low thermal expansion coefficient. However, carbon fibers are insufficient in electric conductivity and thermal conductivity. On the other hand, although such metals as copper, silver and aluminum have a high thermal expansion coefficient, they are excellent in the electric conductivity. Namely, properties of these metals are quite opposite to properties of carbon fibers. Accordingly, if such metal is combined in certain proportions with carbon fibers, there will be obtained a material of a low thermal expansion, high electrical conductivity and high thermal conductivity. Especially, copper matrix-carbon fiber composites which are cheap and excellent in the elastic conductivity have a high practical value and it is expected that these materials can be applied to various equipments. For example, if such a composite is used as a substrate for a silicon semiconductor element, a semiconductor device having a high capacity will be prepared with ease at a low cost.

When the fiber direction is fixed in a copper-carbon fiber composite, the thermal expansion coefficient is low in the longitudinal direction of the fiber but is high in the direction perpendicular to said direction. In short, if carbon fibers have a unidirectional characteristic, the thermal expansion characteristic of the composite is anisotropic. Accordingly, when the composite is applied to a semiconductor device or the like, it is necessary to render fiber directions random to thereby expel the anisotropic characteristic of the thermal expansion coefficient. As one of means for attaining this object, there can be mentioned a method in which carbon fibers are arranged in a net-like form. This method, however, is defective in that production of composites is troublesome and difficult. When carbon fibers are randomly arranged in the copper matrix, the anisotropic characteristic of the thermal expansion coefficient is completely expelled. However, it has been found that if the composite is subjected to a temperature higher than the softening point of the copper matrix, an abnormal volume change takes place and this abnormal volume change results in deformation and breakdown of the composite. This undesired phenomenon takes place frequently especially when the volume ratio of carbon fibers is increased to reduce the thermal expansion coefficient of the composite. Further, in connection with the influences of temperatures, deformation and breakdown are caused by exposing the composite to a high temperature for a short time as in case of brazing, and further, even if the exposure temperature is relatively low, deformation and breakdown similarly take place when the composite is exposed for a long time.

As a result of our research efforts made on the above undesired phenomenon of deformation and breakdown by the temperature change, it was confirmed that breakdown is due to elastic deformation of carbon fibers. More specifically, in order to increase the amount of carbon fibers in the copper matrix, it is necessary to compress a mass of fibers entangled in random directions, and if such carbon fibers in which elastic deformation has been caused by this compression are sealed into the copper matrix, a large inner stress is left in the resulting composite and so far as the strength of the matrix is sufficiently stronger than the compression stress left in the fibers, deformation or breakdown is not caused in the composite but if there is a weak portion in the matrix in the composite, the stress is concentrated to this weak portion and finally overall breakdown takes place in the composite. Accordingly, it has been found that a risk of such deformation or breakdown is greatly reduced when the fiber amount is small or the ratio of the length to the diameter in the used fibers is low even if the fiber amount is relatively large.

SUMMARY OF THE INVENTION

It is a primary object of the present invention to provide a carbon fiber-copper matrix composite having no directional characteristic in either mechanical properties or linear thermal expansion coefficient and a process for the preparation of such composite.

Another object of the present invention is to provide a carbon fiber-copper matrix composite having a low inner stress and a low linear thermal expansion coefficient and a process for the preparation of such composite.

Still another object of the present invention is to provide a carbon fiber-copper matrix composite having such an excellent thermal stability that when it is heated at a temperature ranging from the recrystallization temperature of copper to an ordinary brazing temperature, any substantial abnormal volume change is not caused to occur.

According to the present invention, the foregoing objects can be attained by a carbon fiber-copper matrix composite formed by mixing homogeneously:
(1) carbon fibers non-directionally entangled with one another,
(2) an additive element capable of forming a carbide and bonding the carbon fibers together; and
(3) a copper matrix, and molding integrally the mixture by heating the mixture under pressure in a non-oxidizing atmosphere at a temperature lower than the melting point of copper.

DESCRIPTION OF THE PREFERRED EMBODIMENTS

Figure 1:
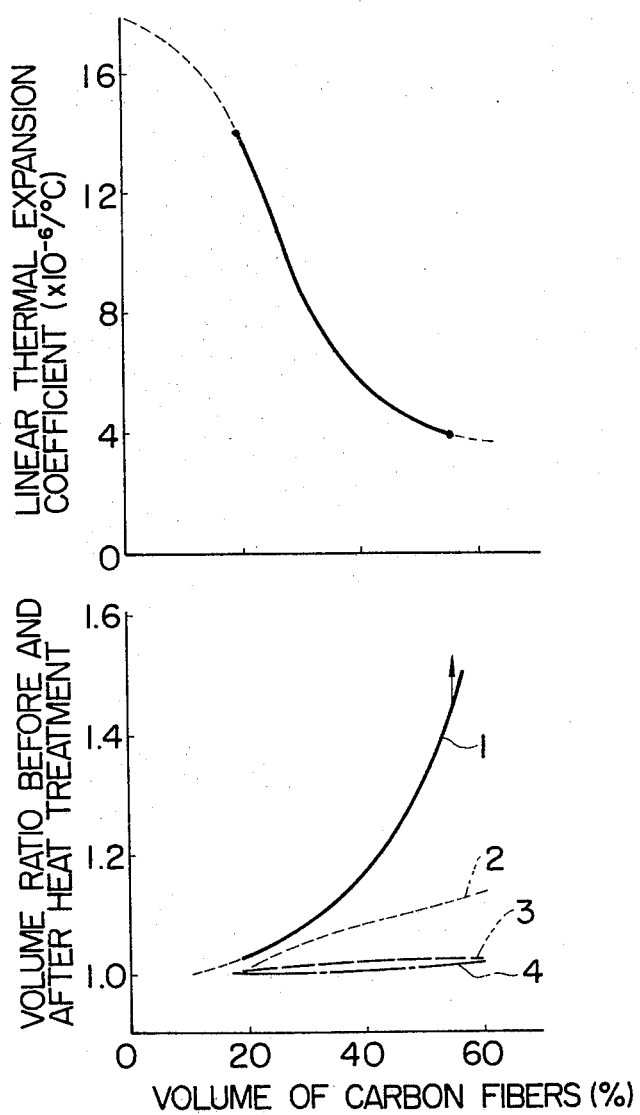
FIG. 1 is a graph showing influences of the volume ratio of carbon fibers in the composite on the linear thermal expansion coefficient and the ratio between the volumes before and after a heat treatment conducted at 800° C. for 30 minutes.

The carbon fiber-copper matrix composite of the present invention has a mechanical strength quite similar to that of copper, but its linear thermal expansion coefficient is lower than 12 × 10$^{-6}$/° C. (on the average in the range of 0° to 250° C.) and is not directional at all. Further, when the composite of the present invention is heated at a temperature ranging from the recrystallization temperature of copper, i.e., about 200° C., to an ordinary brazing temperature, i.e., about 800° C., permanent deformation is hardly caused to occur. The copper matrix is formed by pressing a powder or thin film of copper or a copper alloy and sintering the pressed copper or copper alloy at a temperature lower than the melting point thereof.

Carbon fibers have a diameter (D) not larger than scores of μm and the ratio of the length (L) to the diameter (D), i.e., the ratio L/D, is at least 200. This ratio L/D is called "the aspect ratio" in the definition of this invention. In case of carbon fibers having an aspect ratio lower than 200, it is impossible to reduce the linear thermal expansion coefficient to a desirable low level in the resulting composite. If the aspect ratio is higher than 500, the linear thermal expansion coefficient can be maintained at a substantially constant level. When the diameter of carbon fibers is 5 μm, the length must be larger than 1 mm, and if the length is larger than 3 mm in this case, the linear thermal expansion coefficient is substantially constant and is about $5 \times 10^{-6}/°$ C. (in the range of from room temperature to 250° C.). However, if the fiber length is too large, the production of the composite becomes difficult.

In order to reduce the thermal expansion coefficient of the copper matrix sufficiently, it is necessary to incorporate carbon fibers in an amount of at least 20 volume % based on the composite. If the amount of carbon fibers is smaller than 20 volume %, no effective overlapping or entanglement can be obtained among fibers and hence, the effect of reducing the overall linear thermal expansion coefficient in the composite cannot be obtained. Effective linkages or entanglements can be attained among carbon fibers if the amount of the carbon fibers is larger than 20 volume %, and hence, a high effect of lowering the thermal expansion coefficient of the copper matrix can be obtained. As the proportion of the carbon fibers in the composite is increased, the properties of the composite become similar to the inherent properties of the carbon fibers. In order to increase the density of carbon fibers, it is necessary to compress them under a large force. From the practical viewpoint, it is not preferred to increase the amount of the carbon fibers beyond 75 volume %. Not only bare carbon fibers but also carbon fibers having surfaces coated with copper or a copper alloy may be used as the carbon fibers in the present invention. Further, it is possible to use carbon fibers having surfaces coated with an additive element which will be described in detail hereinafter.

In order to arrange the carbon fibers nondirectionally, namely at random, carbon fibers are stirred at a high speed in a liquid medium such as water or an alcohol. When copper powder acting as the matrix is added to this agitation system, a homogeneous mixture of the carbon fibers and copper matrix can be obtained by this stirring treatment.

Another method for arranging carbon fibers nondirectionally comprises blowing carbon fibers into a rotary drum being rotated at a high speed.

An additive element is incorporated in the mixture for forming the composite so as to fix the highly compressed state in the entangled carbon fibers. The additive element forms a carbide at parts falling in contact with carbon fibers and the carbon fibers are bonded together strongly through the so formed carbide of the additive element. Since the additive element in the matrix has a high affinity with copper, an effect of enhancing the bondage between the carbon fibers and the copper matrix is attained. However, this is a subsidiary effect and the substantial effect intended by addition of an additive element in the present invention is one of bonding the carbon fibers together as pointed out hereinbefore to thereby form a three-dimensional skeleton.

If the additive element is wholly solid-soluble in copper, formation of such three-dimensional skeleton is not promoted at all by addition of the additive element. Accordingly, such element is not adopted in the present invention as the additive element even if it has a high effect of bonding carbon fibers. Further, when the additive element is dissolved in a large amount into the copper matrix, the electric conductivity of the matrix is reduced. Accordingly, when it is desired to obtain a composite having a high electric conductivity, the solid solubility of the additive element in copper at the application temperature must be lower than 1%.

The melting point of the carbide of the additive element is higher than the melting point of copper and the mechanical properties of the carbide are sufficiently higher than those of copper at temperatures in the range of from the recrystallization temperature of copper, i.e., about 200° C., to an ordinary brazing (hard brazing) temperature, i.e., about 800° C.

As the additive element satisfying all of the foregoing requirements, we have found the following elements:
(1) Group A: Titanium (Ti), zirconium (Zr) and niobium (Nb).
(2) Group B: Vanadium (V), chromium (Cr), molybdenum (Mo) and tungsten (W).

These elements may be used singly, or mixtures of two or more of these elements may be used.

The amount of such additive element must be larger than the maximum solid solubility limit of additive element in the copper. More specifically, in case of the additive elements of the group A, the amount is at least 3 volume %, preferably at least 5 volume %, based on the total volume of the composite. In case of the additive elements of the group B, the amount is at least 5 volume %, preferably at least 8 volume %, based on the composite volume.

Since the wettability between carbon fibers and copper is poor, even if a carbon fiber skeleton is immersed in a metal of copper, a composite having a high density cannot be obtained. In order to obtain a composite having a high density and a low linear thermal expansion coefficient as intended in the present invention, it is necessary to increase the proportion of carbon fibers. The above-mentioned method comprising immersing a carbon fiber skeleton in a melt of copper is not suitable for production of such composite. Therefore, according to the present invention, a composite is prepared at a temperature in the range where the wettability of components is of no significance, namely at a temperature higher than the recrystallization temperature of copper but lower than the melting point of copper. Since each of the melting points of carbon fibers and the additive element is higher than the melting point of copper as the matrix, it is preferred that the solid phase reaction for formation of the intended composite be carried out at a temperature lower than the melting point of copper, i.e., about 1080° C., but close to this melting point. In case of titanium (Ti) or zirconium (Zr), the melting point of the matrix is lowered to about 880° to 1000° C. because such element forms a eutectic alloy having a melting point of about 880° C. with copper. However, since such additive element promptly reacts with carbon to form a carbide, even if a liquid phase is temporarily formed partially in the mixture, no particular disadvantage is brought about. In such case, since a layer of the additive element is formed on the entire surfaces of the carbon fibers, the skeleton is rather preferably strengthened when such additive element is employed.

Since the solid phase reaction is one influenced predominantly by diffusion, if reactants have a large number of contact points, the reaction is advanced promptly. Accordingly, it is desirable to supply either the starting copper material for the copper matrix or the additive element in the form of a thin film or powder. This is also preferred for obtaining a homogeneous mixture. When powders having a particle size smaller than 10 $\mu$m or thin films having a thickness smaller than scores of $\mu$m are employed, a good composite can be obtained. Compression is effective for increasing contact points and the proportion of carbon fibers.

At the step of sintering the metallic materials, the sintering reaction and the carbide-forming reaction are advanced in a non-oxidizing atmosphere, preferably a reducing atmosphere.

As means for formation the composite of the present invention, there may be employed any of reaction vessels in which the above-mentioned temperature, pressure and atmosphere conditions are satisfied, and especially good results are obtained when a hot press device heretofore used for production of powder sintered products is employed. A good composite is prepared by charging a homogeneous mixture of starting materials in a mold, subjecting the mixture to pre-heating to remove gases formed by this pre-heating, and heating the mixture under pressure in an inert gas. For example, when the mixture is maintained at a temperature of 1000° C. and a pressure of 300 Kg/cm$^2$ for about 1 hour and the temperature is lowered while maintaining the above pressure, a good composite can be prepared very effectively. However, if the amount of the carbon fibers is larger than 40 volume % and the temperature is higher than 850° C., even when a good composite is obtained, since the elastic force of the skeleton formed by the carbon fibers is much higher than the strength of the copper matrix, there is a risk of occurrence of thermal deformation in the resulting composite. In order to prevent occurrence of such thermal deformation, after completion of the reaction for formation of the composite, the above-mentioned high pressure is maintained until the product is cooled to 850° C. or a lower temperature.

The present invention will now be described in detail by the following examples that by no means limit the scope of the invention.

EXAMPLE 1

Copper was plated in a thickness of 1.7 $\mu$m on the surfaces of carbon fibers having a diameter of 9 $\mu$m, and the plated fibers were cut into length of about 5 mm. The so prepared copper-coated carbon fibers were immersed in a 3% aqueous solution of methyl cellulose, the apparent volume of the solution being about 2 times the apparent volume of the carbon fibers. Then, a calculated amount (5 or 10 volume % based on the resulting composite) of an additive element having a size not exceeding 300 mesh was added to the aqueous solution in which the carbon fibers were immersed. Then, the mixture was violently agitated by an impeller agitator, and the mixture was charged in a drier to remove water therefrom. Then, the mixture was packed in a graphite mold having a length of 30 mm and a width of 60 mm and heated under pressure in a hydrogen gas atmosphere. Namely, the mixture was first maintained at 250° C. and 50 Kg/cm$^2$ for 15 minutes and then at 950° C. and 300 Kg/cm$^2$ for 1.5 hours. Then, while maintaining this elevated pressure, the temperature was lowered to room temperature to obtain a composite having no directional characteristic.

With respect to the so obtained non-directional composite, the density ratio (the ratio of the actual density of the composite to the theoretical density), the electric conductivity at room temperature, the average linear thermal expansion coefficient in the range of from room temperature to 300° C. and the ratio between the volumes before and after the heat treatment conducted at 800° C. for 30 minutes were determined to provide the results shown in Table 1.

For comparison, results obtained with respect to a sample prepared without addition of an additive element (sample no. 15) are also shown in Table 1.

Table 1

| Sample No. | Composition of Composite (volume %) | Density Ratio (%) (based on theoretical density) | Electric Conductivity (IACS, %) | Average Linear Thermal Expansion Coefficient ($10^{-6}$/° C.) | Volume Ratio |
|---|---|---|---|---|---|
| 1 | 45C - 50CU - 5Ti | 90 | 17 | 4.5 | 1.02 |
| 2 | 45C - 45Cu - 10Ti | 93 | 14 | 4.6 | 1.01 |
| 3 | 45C - 50Cu - 5Zr | 92 | 17 | 4.7 | 1.08 |
| 4 | 45C - 45Cu - 10Zr | 96 | 16 | 4.5 | 1.01 |
| 5 | 45C - 50Cu - 5Nb | 87 | 28 | 4.4 | 1.06 |
| 6 | 45C - 45Cu - 10Nb | 78 | 30 | 4.5 | 1.01 |
| 7 | 45C - 50Cu - 5V | 85 | 34 | 4.9 | 1.08 |
| 8 | 45C - 45Cu - 10V | 86 | 32 | 4.6 | 1.04 |
| 9 | 45C - 50Cu - 5Cr | 93 | 30 | 4.7 | 1.12 |
| 10 | 45C - 45Cu - 10Cr | 95 | 28 | 4.5 | 1.09 |
| 11 | 45C - 50Cu - 5Mo | 79 | 32 | 4.5 | 1.1 |
| 12 | 45C - 45Cu - 10Mo | 76 | 29 | 4.5 | 1.06 |
| 13 | 45C - 50Cu - 5W | 75 | 31 | 4.2 | 1.1 |
| 14 | 45C - 45Cu - 10W | 77 | 29 | 4.0 | 1.07 |
| 15 | 45C - 55Cu | 97 | 45 | 4.9 | 1.4~2 |

EXAMPLE 2

Carbon fibers having a diameter of 7 $\mu$m and a length of 10 mm (aspect ratio = 1428), copper powder having a size not exceeding 325 mesh, and powder having a size not exceeding 325 mesh and being composed of a 1 : 1 mixture of titanium and niobium as the additive element were mixed at such a mixing ratio as would provide a theoretical volume ratio in the resulting product, shown in Table 2. In Table 2, samples Nos. 16, 18 and 22 are comparative samples.

Table 2

| Sample No. | Carbon Fiber (volume %) | Copper Powder (volume %) | Additive Element (volume %) |
|---|---|---|---|
| 16 | 20 | 80 | 0 |
| 17 | 20 | 70 | 10 |
| 18 | 30 | 70 | 0 |
| 19 | 30 | 67 | 3 |
| 20 | 30 | 65 | 5 |
| 21 | 30 | 60 | 10 |
| 22 | 55 | 45 | 0 |
| 23 | 55 | 42 | 3 |
| 24 | 55 | 40 | 5 |
| 25 | 55 | 35 | 10 |
| 26 | 60 | 35 | 5 |
| 27 | 60 | 30 | 10 |

Water and polyvinyl alcohol were added to the above starting materials, and the mixture was blended and agitated by a crushing mixer and pressed to remove water therefrom. The mixture pressed in blocks was divided into pieces having a size conformable to the size of a mold of a hot press and charged into the mold of the hot press. The pressure was elevated to 300 Kg/cm² and the temperature was gradually elevated in a hydrogen gas atmosphere. The mixture was maintained at 1000° C. for about 1 hour and then, the compressed mixture was cooled by gradually lowering the temperature to obtain a composite.

The density of the so obtained composite was substantially 100% of the theoretical value when the amount of the carbon fibers was either 20 volume % or 30 volume %. When the amount of the carbon fibers was 55 volume %, the density was 75 to 85% of the theoretical value.

Results of the measurement of the average linear thermal expansion coefficient in the range of from room temperature to 250° C. and the ratio between the volumes before and after the heat treatment conducted at 800° C. for 30 minutes are shown in FIG. 1. It is seen that the linear thermal expansion coefficient is hardly influenced by the amount added of the additive element but predominantly determined by the amount of the carbon fibers. However, the ratio between the volumes before and after the heat treatment is influenced by the amount added of the additive element.

More specifically, in FIG. 1, curve 1 shows the above-mentioned volume ratio of the comparative composite composed of the carbon fibers and copper alone and not containing the additive element at all, curve 2 shows the above-mentioned volume ratio of the composite containing 3 volume % of the additive element, curve 3 shows the above-mentioned volume ratio of the composite containing 5 volume % of the additive element and curve 4 shows the above-mentioned volume ratio of the composite containing 10 volume % of the additive element.

When this volume ratio is higher than about 1.2, cracks are formed in the composite by heating, and if the amount of the additive element is at least 3 volume % based on the composite, occurrence of thermal breakdown can be prevented.

Figure 2:
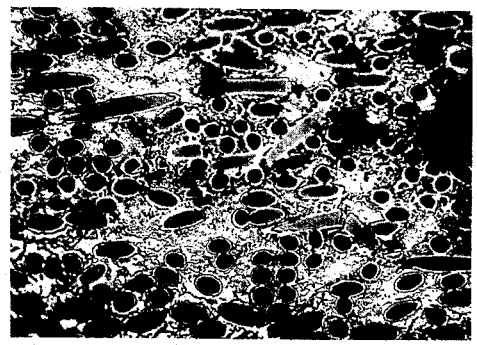
FIG. 2 is a microscopic photograph showing the section of a composite comprising 30 volume % of carbon fibers, 10 volume % of an additive element mixture containing titanium and niobium at a ratio of 1 : 1 and 60 volume % of copper.

The microscopic photograph of the section of the composite containing 30 volume % of carbon fibers and 10 volume % of the additive element with the balance being copper is shown in FIG. 2 (the magnification being 500 times). It is seen that a carbide layer is formed along the periphery of the section of each carbon fiber and carbon fibers are bonded together through such carbide layers.

EXAMPLE 3

Carbon fibers having a diameter of 7 μm were cut into prescribed length to obtain a carbon fiber material having an aspect ratio of 50, 100, 200, 500 or 1000. This fiber material was mixed with copper powder having a diameter of 2 μ and zirconium powder having a diameter of 4 μ. A composite was prepared from this mixture in the same manner as described in Example 2. The resulting composite was composed of 54 volume % of the carbon fibers, 31 volume % of the copper matrix and 15 volume % of zirconium. For comparison, a composite free of zirconium was prepared.

Figure 3:
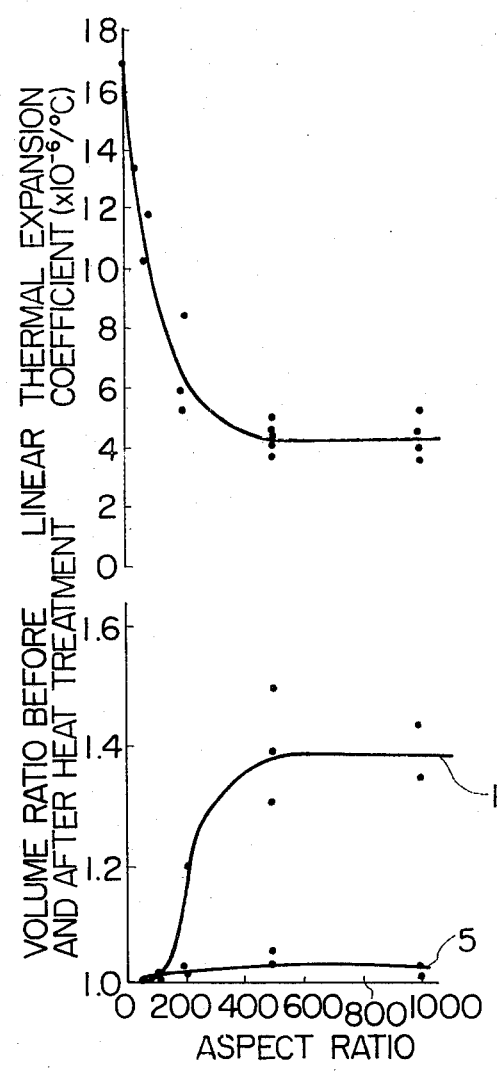
FIG. 3 is a graph showing the relation of the aspect ratio of carbon fibers to the linear thermal expansion coefficient of the resulting composite and the ratio between the volumes before and after a heat treatment conducted at a temperature of 800° C. for 30 minutes.

With respect to each of the so prepared composites, the average linear thermal expansion coefficient in the range of from room temperature to 250° C. and the ratio between the volumes before and after the heat treatment conducted at 800° C. for 30 minutes were determined to obtain results shown in FIG. 3.

From the results shown in FIG. 3, it is seen that the linear thermal expansion coefficient is hardly influenced by the presence or absence of zirconium as the additive element but it is remarkably changed depending on the aspect ratio of the carbon fibers used. More specifically, the fibers having an aspect ratio lower than 200 and hence, having a shape resembling the particle shape have a higher linear thermal expansion coefficient. The linear thermal expansion coefficient of the fibers having an aspect ratio of 200 is about $6 \times 10^{-6}/°$ C. and when the aspect ratio is higher than 500, the linear thermal expansion coefficient is maintained at a substantially constant level approximating to $4.5 \times 10^{-6}/°$ C.

Curve 1 shows the data of the above-mentioned volume ratio obtained with respect to the composite composed only of the carbon fibers and the copper matrix and free of the additive element and curve 5 shows the data of the above-mentioned volume ratio obtained with respect to the composite containing 15 volume % of zirconium as the additive element.

As it will readily be understood from the results shown in FIG. 3, a composite having a low linear thermal expansion coefficient is prepared by using carbon fibers having an aspect ratio of at least 200 and in order to obtain a stable composite including no risk of thermal breakdown by using carbon fibers having an aspect ratio of at least 200, it is necessary to add a sufficient amount of the additive element.

EXAMPLE 4

Carbon fibers coated with copper in a thickness of 0.1 μm were cut into length of 5 mm and immersed in water having a volume about 10 times the volume of the carbon fibers, and the mixture was violently agitated for about 2 hours by means of an impeller type agitator. The fibers were closely entangled with one another in water by this agitation treatment and the fiber arrangement was rendered completely random. The carbon fibers were taken out of water and charged in a crushing mixer, into which copper powder having a particle size of 2 μm and zirconium powder having a particle size of 4 μm were introduced together with a 3% aqueous solution of methyl cellulose, the volume of the solution being equal to the total volume of the copper and zirconium powders. The resulting mixtures comprised 20, 35 or 50 volume % of the carbon fibers and 10 volume % of zirconium, the balance being copper.

The paste formed in the crushing mixer was dried. The dried mixture had a density of about 50% based on the theoretical density. The mixture was maintained at 1000° C. for 1 hour in a hydrogen atmosphere under a pressure of 0, 50, 100, 200, or 300 Kg/cm$^2$ to form a composite.

The ratio (%) of the density of the resulting composite to the theoretical density was determined to obtain results shown in Table 3.

Table 3

| Pressure (Kg/cm$^2$) | Volume % of Carbon Fibers | | |
|---|---|---|---|
| | 20 | 35 | 50 |
| 0 | − 50 | 50 | 50 |
| 50 | 75 − 85 | 73 − 80 | 70 − 78 |
| 100 | 88 − 98 | 85 − 93 | 78 − 90 |
| 200 | 95 − 100 | 95 − 100 | 85 − 95 |
| 300 | 95 − 100 | 95 − 100 | 90 − 98 |

From the results shown in Table 3, it is seen that in order to obtain a composite having a high electric conductivity by elevating the density of the composite, it is necessary to apply a pressure of at least 100 Kg/cm$^2$ and if it is intended to prevent thermal breakdown, a pressure of 50 Kg/cm$^2$ is sufficient.

What is claimed is:

1. A non-directional carbon fiber-copper matrix composite comprising randomly arranged carbon fibers having an aspect ratio of at least 200 and a copper matrix in which the carbon fibers are embedded, said carbon fibers being bonded together by an additive element forming a carbide at parts of the additive element falling in contact with the carbon fibers and the amount of the carbon fibers being at least 20 volume % based on the total composite, said additive element being at least one element selected from the group consisting of members A and B, said member A consisting of at least one of titanium, zirconium niobium and member B consisting of at least one of vanadium, chromium, molybdenum and tungsten, the amount of the element of member A being at least 3 volume % based on the composite and the amount of the element of member B being at least 5 volume % based on the composite.

2. A non-directional carbon fiber-copper matrix composite according to claim 1, wherein said composite has a linear thermal expansion coefficient which is lower than 12 × 10$^{-6}$/° C. on the average in the range of 0° to 250° C. and a density which is at least 70% of the theoretical density.

3. A non-directional carbon fiber-copper matrix composite according to claim 1, wherein the amount of carbon fibers is from 20 volume % to 75 volume % based on the total composite.

4. A non-directional carbon fiber-copper matrix composite comprising carbon fibers having an aspect ratio of at least 200 and arranged in random directions, said carbon fibers being bonded together through at least one additive element selected from the group consisting of titanium, zirconium, niobium, vanadium, chromium, molybdenum and tungsten, and a copper matrix integrated with said carbon fibers, wherein the amount of the carbon fibers is at least 20 volume % based on the composite, the density of the composite is at least 70% of the theoretical density, and the linear thermal expansion coefficient of the composite is lower than 12 × 10$^{-6}$/° C. on the average in the range of 0° to 250° C.

5. A non-directional carbon fiber-copper matrix composite according to claim 4, wherein the composite has a linear thermal expansion coefficient which is lower than 12 × 10$^{-6}$/° C. on the average in the range of 0° to 250° C.

6. A process for the preparation of non-directional carbon fiber-copper matrix composites comprising mixing and agitating carbon fibers having an aspect ratio of at least 200 with a powder of at least one additive element selected from the group consisting of titanium, zirconium, niobium, vanadium, chromium, molybdenum and tungsten and a powder of copper in a liquid medium, removing the liquid medium from the resulting mixture, and heating the residual mixture under a pressure of a least 50 Kg/cm$^2$ in a non-oxidizing atmosphere at a temperature higher than the recrystallization temperature of copper but lower than the melting point of copper whereby the carbon fibers are bonded together by the additive element forming a carbide at parts of the additive element falling in contact with the carbon fibers; with the amount of carbon fibers being at least 20 volume % based on the resulting composite and the amount of the additive element being at least 3 volume % based on the composite when the additive element is titanium, zirconium, or niobium or at least 5 volume % based on the composite when the additive element is vanadium, chromium, molybdenum or tungsten.

7. A process for the preparation of non-directional carbon fiber-copper matrix composites according to claim 6, wherein the residual mixture is heated under a pressure of at least 100 Kg/cm$^2$.

8. A process for the preparation of non-directional carbon fiber-copper matrix composites according to claim 6, further comprising cooling the heated residual mixture to a temperature of at least 850° C. while maintaining said pressure of at least 50 Kg/cm$^2$.

9. A process for the preparation of non-directional carbon-copper matrix composites according to claim 6, wherein the amount of carbon fibers is from 20 volume % to 75 volume % based on the total composite.

10. A process for the preparation of non-directional carbon fiber-copper matrix composites that have a linear thermal expansion coefficient that is on the average lower than 12 × 10$^{-6}$/° C. in the range of 0° to 250° C. and in which the carbon fibers have an aspect ratio of at least 200, are at least 20% of the volume of the composite and are arranged non-directionally therein, which comprises mixing carbon fibers coated with copper in a liquid medium with a powder of at least one additive element selected from the group consisting of A and B, member A consisting of at least one of titanium, zirconium and niobium and member B consisting of at least one of vanadium, chromium, molybdenum and tungsten, the amount of the element of member A admixed with the fibers being at least 3 volume % based on the composite and the amount of the element of member B admixed with the carbon fibers being at least 5 volume % based on the composite, removing the liquid medium from the resulting mixture and heating the mixture separated from the liquid medium at a temperature higher than the recrystallization temperature of copper but lower than the melting point of copper under a pressure of at least 50 Kg/cm$^2$ in a non-oxidizing atmosphere.

11. A process for the preparation of non-directional carbon fiber-copper matrix composites according to claim 10, wherein the mixture separated from the liquid medium is heated under pressure in a hydrogen gas atmosphere, the mixture being first maintained at 250° C. and 50 Kg/cm$^2$ for 15 minutes and then at 950° C. and 300 Kg/cm$^2$ for 1.5 hours and then the temperature of the mixture is lowered to room temperature while maintaining the elevated pressure.

* * * * *